United States Patent [19]
Gentzler

[11] Patent Number: 5,796,304
[45] Date of Patent: Aug. 18, 1998

[54] BROADBAND AMPLIFIER WITH QUADRATURE PILOT SIGNAL

[75] Inventor: Charles R. Gentzler, Thousand Oaks, Calif.

[73] Assignee: Powerwave Technologies, Inc., Irvine, Calif.

[21] Appl. No.: 639,264

[22] Filed: Apr. 24, 1996

[51] Int. Cl.[6] .................................................. H03F 3/66
[52] U.S. Cl. ........................................... 330/52; 330/151
[58] Field of Search ............................. 330/52, 149, 151

[56] References Cited

U.S. PATENT DOCUMENTS

| | | | |
|---|---|---|---|
| 3,922,617 | 11/1975 | Denniston et al. | 330/149 |
| 4,580,105 | 4/1986 | Myer | 330/149 |
| 5,077,532 | 12/1991 | Obermann et al. | 330/151 |
| 5,130,663 | 7/1992 | Tattersall, Jr. | 330/52 |
| 5,323,119 | 6/1994 | Powell et al. | 330/52 |
| 5,455,537 | 10/1995 | Larkin et al. | 330/52 |
| 5,528,196 | 6/1996 | Baskin et al. | 330/151 |
| 5,576,659 | 11/1996 | Kenington et al. | 330/52 |

*Primary Examiner*—Steven J. Mottola
*Attorney, Agent, or Firm*—Fish & Richardson P.C.

[57] ABSTRACT

A broadband feed-forward amplifier configuration includes an amplifier having an input and an output. A comparison loop compares the signal output to the amplifier with a signal input to the amplifier to generate an error signal and this error signal is inverted, processed, and amplified to provide a correction signal at the output of the amplifier (the cancellation loop). In the cancellation loop and at the input of the main amplifier, the circuit includes gain and phase correction circuitry for correcting small variations in amplitude and phase. A quadrature modulated pilot signal is injected at the input to the main amplifier path and is cancelled in the output to generate control signals for controlling the gain and phase correction circuits within the cancellation loop and within the main amplification loop.

21 Claims, 4 Drawing Sheets

1

BROADBAND AMPLIFIER WITH QUADRATURE PILOT SIGNAL

FIELD OF THE INVENTION

The present invention relates generally to amplifiers, and in particular, to feed-forward, broadband power amplifier configurations.

BACKGROUND OF THE INVENTION

Feed-forward, broadband power amplifiers are well known. Feed-forward correction is typically used to cancel distortion produced by a main power amplifier operating as a class AB amplifier. Although class A amplifiers usually produce less distortion than class AB amplifiers, class A amplifiers are also less efficient than class AB amplifiers. Thus, in order to retain the advantages of efficiency and low distortion, class AB amplifier configurations are implemented within a feed-forward error correction configuration.

Such feed-forward amplifier configurations typically include a main amplification path in a comparison loop, together with a feed-forward compensation path in a cancellation loop. In such a configuration, generally speaking, an attenuated version of the output signal from the main amplifier is compared with the input signal to the main amplifier (appropriately delayed) to generate an error signal. This error signal is then amplified by a secondary amplifier, and fed forward to be combined with the output of the main amplifier (appropriately delayed) to cancel undesirable distortion present in the main amplifier output.

It has been found that feed-forward cancellation is particularly advantageous in conjunction with broadband power amplifiers which operate at very high frequencies. Feedback cancellation is typically less accurate than feed-forward cancellation under such operating conditions because the time which it takes to feed the signal back from the output to the input is often so long that the input signal has a different morphology, and thus the feedback information is not useful.

However, even in many feed-forward amplifier configurations, a certain amount of instability can be observed. Specifically, amplifier drift can be caused by temperature transients; and, if amplifier characteristics are sensitive to average power input, there can be amplifier instability. Typically, these parameters are slowly varying (for example, a typical response time would be on the order of one millisecond); and even a low bandwidth amplifier has a signal bandwidth of 1 MHz, which corresponds to a period of one microsecond.

To compensate for these instabilities, amplitude and phase correction circuits have been introduced into the feed-forward cancellation loop and also into the main amplifier comparison loop. The amplitude and phase correction circuits present in the cancellation loop are controlled to insure that the error signal supplied to the input of the secondary amplifier contains only distortion components and does not include any portion of the actual input signal. The amplitude and phase correction circuits in the main amplification loop are used to compensate for changes in the main amplifier and to insure that the signal output by the main amplifier and provided to an input of the comparator in the comparison loop is comparable to the amplified signal before drift or other amplifier variations take place.

To provide control inputs for the amplitude and phase correction circuits, some systems introduce a pilot signal at the input of the feed-forward broadband amplifier. This pilot signal is then detected at the output of the amplifier and used to provide control input signals to both the amplitude and phase correction circuits within the cancellation loop. In prior configurations, if amplitude and phase correction circuits are introduced both in the cancellation loop and in the main amplification comparison loop, separate pilot signal inputs would be required to provide control signals for the amplitude and phase correction circuits in each loop, since the pilot signal input to the main amplifier loop is typically canceled before it can be used in a second loop.

SUMMARY OF THE INVENTION

An amplifier arrangement according to the invention, includes a main amplifier to which feed-forward cancellation is applied. The amplifier has a comparison loop, including a comparator, which compares a signal input to the main amplifier with a signal output from the main amplifier to provide an error signal, and a cancellation loop, including correction circuitry which adjusts the error signal. A pilot signal modulation circuit quadrature modulates an oscillation signal to generate a quadrature modulated pilot signal which is coupled or added to the amplifier input. A detector circuit connected to the output of the amplifier, provides control signals to the correction circuitry. The detector circuit extracts modulation information from the modulated pilot signal amplifier output to provide the control signals.

In a particular embodiment, the quadrature modulated pilot signal is produced by modulating the two components of the signal with at least two, independent, periodic signals. By way of example, the independent periodic signals may be sine waves having different frequencies (preferably not multiples of each other); and the main amplifier has a broadband radio frequency power amplifier operating in a class AB mode. Phase or gain correction circuitry is preferably included at the input of the main amplifier within the comparison loop.

In accordance with another aspect of the invention, an amplifier configuration features a main amplifier having an input and an output and a quadrature modulation pilot signal generator which generates a quadrature modulated pilot signal that is coupled to the input of the main amplifier. A phase and a gain correction circuit, in communication with the amplifier, corrects phase and/or gain distortion in the output signal from the main amplifier, and a synchronous detection circuit demodulates the quadrature modulated pilot signal present in the output signal of the amplifier and generates phase and a gain control signals which control a phase and gain adjustment of the phase and gain correction circuit.

A further aspect of the invention relates to a method of correcting gain and phase distortion occurring in an amplified signal output from an amplifier having an input and an output. The method features the steps of inputting a signal to be amplified at the input of the amplifier; injecting a quadrature modulated pilot signal at the input of the amplifier; demodulating the quadrature modulated pilot signal component in the output of the amplifier; and using the demodulated pilot signal to generate phase and gain correction signals to provide phase and gain correction of the amplified output signal.

Still another aspect of the invention relates to a method of reducing distortion in an amplified signal. The method features the steps of encoding a constant frequency, known, pilot signal with intelligence having at least two distinguishable modulation codes; adding the encoded pilot signal to the signal to be amplified; amplifying the signal; decoding the amplified encoded pilot signal to recover the intelligence encoded on the pilot signal to obtain information indicative of the distortion in the amplified signal; and adjusting phase and amplitude circuit parameters of the amplified signal, based upon the information, to reduce the distortion. In a preferred embodiment, the distinguishable modulation codes are periodic sine wave oscillations at different frequencies.

Yet another aspect of the invention relates to a method of reducing distortion in a signal amplified within an amplifier circuit by using a plurality of feed-forward signal correction loops to produce a corrected amplified signal. The method features the steps of introducing a pilot signal into only one of the correction loops; processing the amplified signal including the introduced pilot signal to provide amplitude and phase correction signals; and adjusting phase and amplitude parameters of signals related to the amplified signal within two or more of the plurality of feed-forward correction loops based upon the amplitude and phase correction signals.

BRIEF DESCRIPTION OF THE DRAWING

Other objects, features and advantages of the invention will appear from the description taken together with the drawings in which.

DETAILED DESCRIPTION OF THE PREFERRED EMBODIMENTS

Figure 1:
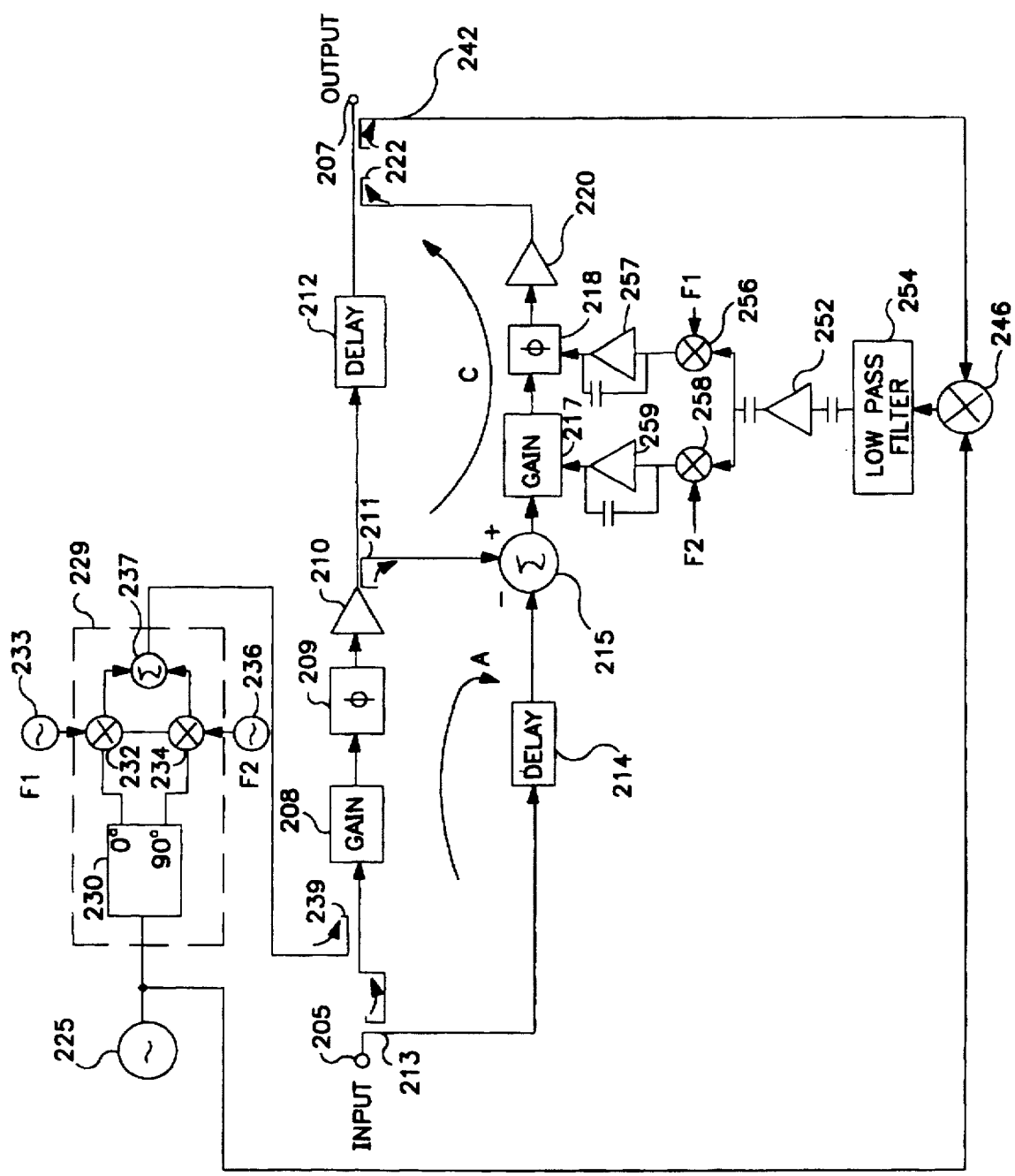
FIG. 1 is a schematic diagram of a feed-forward, broadband amplifier constructed in accordance with the present invention, which includes a gain and phase correction circuit controlled by a quadrature modulated pilot signal in the cancellation loop.

Referring to FIG. 1, in a first embodiment of a feed-forward, broadband amplifier system 100, an input terminal 205 connects, through a coupler 213, to a gain correction circuit 208 in series with a phase correction circuit 209. The gain and phase correction circuits are well known in the art. The output of the phase correction circuit 209 connects to an input of a main amplifier 210. The main amplifier 210 may, for example, be a dual stage amplifier configuration having a pre-amplifier and a second amplifier (not shown), which provide respective 42 and 32 dB gains, thus achieving a net 73 dB gain for the illustrated main amplifier 210. The output of the main amplifier 210 connects to a delay circuit 212, which in turn provides an output signal to an output terminal 207. The delay circuit 212 may be, for example, a coaxial cable or a delay filter having a flat response at the band of frequencies of interest. The gain and phase correction circuits 208, 209, the main amplifier 201, and the delay circuit 212 form the main amplification path between the input terminal 205 and the output terminal 207.

Coupler 213, which in one embodiment may be a ¼ wavelength side or edge-coupled printed circuit line, is coupled at the input 205 of the amplifier configuration 100 and connects, as noted above, to gain circuit 208. Input 205 connects to a delay circuit 214. The delay circuit 214 further connects to a comparator, or subtractor, circuit 215. In one embodiment, the comparator circuit 215 advantageously is a 3 dB hybrid coupler. The comparator circuit 215 further receives an input from a coupler 211 which is coupled to the output of the main amplifier 210. The output of the comparator circuit 215 connects to a gain correction circuit 217 in series with a phase correction circuit 218. The gain and phase correction circuits 217, 218 are substantially similar to the gain and phase correction circuits 208, 209, and receive control inputs, as will be described in greater detail below. The output of the phase correction circuit 218 connects to the input of a secondary cancellation amplifier 220. In one embodiment, the secondary cancellation amplifier 220 has a gain of 60 dB. The output of the cancellation amplifier 220 is provided as an input to a coupler 222 which serves as a combiner, and is coupled to the output of delay circuit 212 of the amplifier configuration 100.

A pilot signal generator 225, in this illustrated embodiment, outputs an oscillation signal and connects to the input of a splitting and phase-shifting circuit 230. The splitting circuit 230 provides a first output which is an in-phase version of the oscillation signal generated by the generator 225. The first, in-phase output of the splitting circuit 230 connects to the input of a multiplier circuit 232 which receives also, an input from a local oscillator 233, while the second, 90° phase shifted, output of the splitting circuit 230 connects to the input of a multiplier 234 which receives, in addition, an input from a local oscillator 236. The local oscillators 233, 236 provide sinusoidal oscillation signals at different frequencies F1 and F2, respectively (e.g., in one illustrated embodiment, the frequencies F1 and F2 are 0.9 kilohertz and 1.6 kilohertz, respectively). The outputs of the multipliers 232, 234 are supplied as inputs to a summing circuit 237. The splitting circuit 230, the multipliers 234, 236, and the summing circuit 237 together form a quadrature modulation circuit 229. The output of the summing circuit 237, the quadrature modulated pilot signal, is coupled to the input from terminal 205 of the amplifier 100 (from coupler 213) through a coupler 239.

An output coupler 242 is coupled to the output line prior to terminal 207 of the amplifier configuration 100 and connects to the input of a multiplier 246. The multiplier 246 also connects to the pilot signal output of the generator 225. The output of the multiplier 246 is fed into the input of a low pass filter 254 having an output connected to an AC coupled amplifier 252. In one advantageous embodiment, the low pass filter 254 is an LC filter having a cutoff frequency of about 50 MHz and a roll off of approximately 12 decibels per octave. Furthermore, it should be understood that a bandpass filter could also be used in place of the low pass filter 254.

The output of the amplifier 252 is AC coupled as a first input to each of first and second multipliers 256, 258. A second input to the multiplier 256 connects to the oscillator 233, providing the output local oscillation signal F1, while the second input of the multiplier 258 connects to the local oscillator 236, providing the local oscillation signal F2. The output of the multiplier 256 connects to an integrator 257 which acts as a low pass filter. The integrator 257 has its output connected to the control input of the phase correction circuit 218. The output of the multiplier circuit 258 connects to the input of an integrator 259 which also acts as a low pass filter and has its output connected to the control input of the gain correction circuit 217.

In operation, broadband radio frequency (RF) signals (for example, in the range 869–894 MHz), which are to be amplified by the amplifier configuration 100, are applied to the input terminal 205 and are fed through coupler 213 to the gain correction circuit 208 and the phase correction circuit 209. The gain correction circuit 208 can be used to adjust the gain of the input signal to reduce small distortion components that may be due to the thermal transients and other effects. The phase correction circuit 209 likewise corrects the phase of the input signal to compensate for phase distortions due to like causes. The gain and phase corrected signal output from the phase corrector 209 is provided as an input to the main amplifier 210. This signal is amplified (by approximately 73 db in one actual embodiment) by the main amplifier 210 (at least one of those amplification elements is a power amplifier operating as a class AB amplifier) and is provided as an input to the delay circuit 212. The delay circuit 212 subsequently introduces a delay into the output signal provided by the amplifier 210, and then provides a signal to the output terminal 207. In this manner, radio frequency broadband signals applied to the input terminal 205 are amplified and supplied to the output terminal 207 of the broadband feed forward amplifier system 100.

In order to compensate for distortions which may occur within the amplifier 210 (for example, because the amplifier 210 is an AB class amplifier for efficiency purposes), a comparison loop generally designated as "A" and a cancellation loop generally designated as "C" are used to provide feed-forward cancellation of distortion components within the output signal present at the output of delay circuit 212. The comparison loop A includes the gain and phase correction circuits 208, 209, the amplifier 210, the coupler 211, the coupler 213, the delay circuit 214, and the comparator circuit 215. The cancellation loop C includes the delay circuit 212, the gain and phase correction circuits 217, 218, the cancellation amplifier 220, the comparator circuit 215, and the coupler (combiner) 222. (Cancellation amplifier 220 preferably operates as a class A amplifier.)

Specifically, to compensate for distortions which may occur within the amplifier 210, the signal applied to the input terminal 205 of the amplifier 100 is connected directly to the delay circuit 214. The delay circuit 214 introduces a delay in the coupled signal which is approximately equal to the delay introduced by the gain correction circuit 208, the phase correction circuit 209, the main amplifier 210, and the coupler 211. The delay circuit 214 provides the coupled input signal to the comparator circuit 215. The comparator circuit 215 further receives an attenuated version of the output signal provided by the main amplifier 210 via the coupler 211. The output signal coupled via the coupler 211 is attenuated so that the amplitude of the input signal supplied by the delay circuit 214 to the comparator 215 is substantially the same as the amplitude of the signal coupled through the coupler 211 to the input of the comparator circuit 215.

The comparator circuit 215 subtracts the input signal provided from the delay circuit 214 and the output signal provided from the coupler 211 to generate an error signal to the gain correction circuit 217. By properly choosing the delay introduced by the delay circuit 214, the waveforms input to the comparator circuit 215 are synchronized, while due to the attenuation of the amplifier output signal, the waveforms input to the comparator circuit are substantially the same amplitude. Thus, in theory, if the amplifier 210 does not introduce any distortion, the inputs to the comparator 215 will be identical, so that there would be no output signal level from the comparator after subtracting the two waveforms.

Since, typically the amplifier 210 introduces some distortion to the input signal during amplification, the amplified signal is not a precise linear amplification of the amplifier input signal. Thus, when the comparator circuit 215 takes the difference between the scaled input and output signals of the amplifier 210, the difference between these signals is representative of the distortion introduced into the output signal by the amplifier 210. This error signal is then adjusted in gain and phase by the gain and phase correction circuits 217, 218. Subsequently, the gain and phase adjusted error signal is supplied as an input to the secondary correction amplifier 220, which amplifies the phase and gain adjusted error signal so that the error signal has substantially the same amplitude as the distortion present within the signal output by the amplifier 210. The amplified error signal (hereinafter referred to as the "cancellation signal"), is connected to coupler 222, and is combined with the delayed output signal from the delay circuit 212. The delay introduced by the delay circuit 212 is sufficient to compensate for delays introduced by the gain and phase correction circuits 217, 218, and the secondary amplifier 220 (this ensures that there is no phase difference between the cancellation signal present at the coupler 222 and the output signal from amplifier 210 due to the delay of passing through the circuits 217, 218, and amplifier 220).

If the comparator circuit 215 does not invert the distortion products present in the output signal, then either the coupler 222 or the amplifier 220 is an inverting circuit so that the amplified error signal is substantially equal in amplitude and opposite in phase (that is, 180° out of phase) with the distortion present in the signal output by the delay circuit 212. Thus, the amplified error signal introduced into the output line by the coupler 222 can be used to cancel the distortion, if any, present in the output of amplifier 210, and the signal provided at the output terminal 207 is substantially a linearly amplified version of the input signal provided at the input terminal 205. In this manner feed-forward cancellation can be used to minimize or eliminate distortion products in the output of the broadband, high-power amplifier 210.

To determine the degree of gain and phase adjustment performed within the gain and phase correction circuits 217, 218, in this embodiment of the invention, the quadrature modulated pilot signal, from summer 237, is introduced, as noted above, at the input of the main amplifier correction circuit 208, 209 through the coupler 239. This pilot signal is thereafter detected and used to provide correction signals to the gain and phase correction circuits 217, 218. Further, in accordance with a preferred embodiment of the invention, the pilot signal is modulated (or encoded) to include information (such as the frequency of modulation) that can later be derived from the detection (or decoding) of the pilot signal.

The quadrature modulated pilot signal passes through the gain and phase correction circuits 208, 209, as well as the amplifier 210 and delay circuit 212. Thus, the quadrature modulated pilot signal is present at the output of the delay circuit 212, and is provided, using the coupler 242, to the multiplier 246. The multiplier 246 also receives the original oscillation signal output from the pilot signal generator 225.

The multiplier 246 serves as a synchronous detector which detects the output signal and outputs a modulation signal representative of the quadrature modulation in the output signal. That is, since the output signal includes a signal component which is derived from the original signal output by the generator 225, when the output signal is multiplied with the signal generated by the generator 225, the result is a signal component which has double the frequency of the original signal output by the generator 225. This is because a signal which is multiplied by an in-phase version of itself produces a squared component which has twice the frequency of the original signal. Furthermore, any modulation of the generator output is also brought down to baseband. Thus, only the quadrature elements of pilot signal, and components which are about double the frequency of the generator output signal, remain at the output of the multiplier 246. (The pilot signal, in these embodiments of the invention, has a frequency of about 867 MHz, about 2 MHz removed from the signal frequencies of interest. The pilot signal frequency can be moved closer to the band of interest, and even into the band of interest, so long as it remains at least about 100 KHz from any signal of interest within the band.)

The double frequency component is filtered out by the low pass filter 254. Therefore, during this detection process, only the substantially baseband related information output of the pilot signal from the multiplier 246 is passed on to the multipliers 256, 258. Thus, the low pass filter ensures that only the frequencies F1 and F2 (for example 900 Hz and 1600 Hz) pass so that other sideband components of the output signal are not presented to the inputs to multipliers 256, 258.

The modulation frequencies F1 and F2, respectively, are applied to the second inputs of the multipliers 256, 258, and these multipliers 256, 258, synchronously detect the modulation signal output from the multiplier 246. The outputs of the multipliers 256, 258, are substantially DC voltages which reflect the change needed is in the amplitude and phase of the signals applied to the second inputs of the multipliers 256, 258 to achieve "perfect" compensation, and which serve as inputs, respectively, to the phase correction circuit 218 and the gain correction circuit 217 through integrators 257, 259, respectively.

Thus, the outputs of the multipliers 256, 258, are essentially DC signals having amplitudes proportional to the change in the amount of gain or phase correction to be employed by the gain or phase correction circuits 217, 218 to the error signal output by the comparator 215. The gain and phase adjustment caused by the gain and phase correction circuits 217, 218 thus acts to cancel any remnant of the pilot signal present at the output terminal 207 of the amplifier 100. When the pilot signal is thus nulled, the signal at the input 205 and the signal at the output 207 are linearly related. In this manner, a distortion free amplified output signal is provided at the output terminal 207 while the pilot signal, used to provide additional stability to the feedforward configuration, is removed from the output signal at the terminal 207.

Thus, the introduction of the quadrature modulated pilot signal at the input to the comparison loop A, provides two independent controls which enable the cancellation loop to properly null the pilot signal at the output 207 thereby yielding a linear power amplification process. The independent control of gain and phase at gain and phase correction circuits 217, 218 by the use of two separate modulation signals improves the ability to lock in and maintain "lock" on the correction process. Other modulation signals can of course be used so long as they are independently detectable. An example of other modulation signals is, for example, a digital pseudo-random code having the effect of spreading the modulation signal energy across a broader band, and even within the band of the signals input at terminal 205. Alternatively, in the first particular embodiment herein disclosed, the pilot signal could be, for example, out of band or in band, and is described as being below band at, for example, 867 MHz.

Alternative Embodiment

Figure 2:
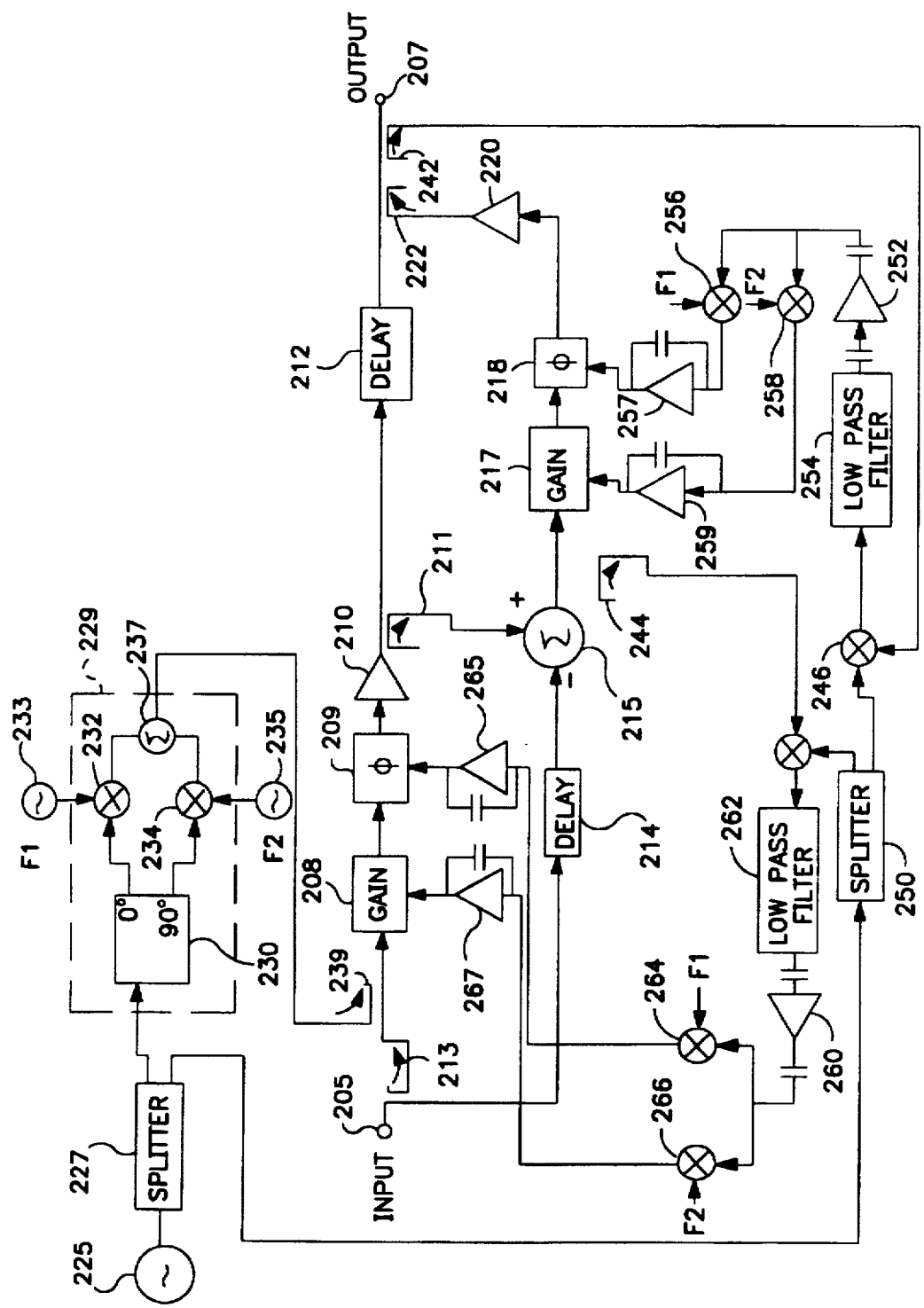
FIG. 2 is a schematic diagram of an alternative embodiment of the feed-forward, broadband amplifier system of the present invention, which includes quadrature modulated pilot signal control of gain and phase correction circuits in the cancellation loop and in the comparison loop at the input of the main amplifier.

In a second particular embodiment of the invention, the feed-forward, broadband power amplifier system employs a single quadrature modulated pilot signal to effect gain and phase control in both the comparison loop A and the cancellation loop C. The use of a single pilot signal in the broadband amplifier 300, referring to FIG. 2, provides distinct advantageous operation over the embodiment of FIG. 1, and importantly provides better thermal and drift compensation in the comparison loop. In the schematic block diagrams of FIGS. 1 and 2, like elements which perform substantially the same functions are indicated by like reference numerals. The overall structure and operation of the feed-forward, broadband amplifier configuration 300 is substantially similar to the operation of the amplifier configuration 200 depicted in FIG. 1, with the exception of the additional detection and control circuitry provided in the amplifier configuration 300 to effect feedback control of the gain and phase correction circuits 208, 209.

As briefly discussed above, the gain and phase correction accomplished in the main amplifier path (as part of the comparison loop A) is performed to insure that the inputs to the comparator circuit 215 are substantially identical (to compensate for thermal effects, etc.), while gain and phase correction in the cancellation loop C insure that the error output by the comparator circuit 215 is equal and opposite to the distortion and pilot signal components in the output of the delay circuit 212.

The signal produced by the pilot signal generator 225 is split by a splitting circuit 227 and one of the split outputs enters a second splitting circuit 250. The splitting circuits 227, 250 serve simply to divide the input signal into substantially equal portions which are similar to the input signal, with the only exception being that the identical signals output from the signal splitter 227, 250 are approximately half the power of their respective input signals. A first output of the signal splitter circuit 250 is provided as an input to the multiplier 246 while a second output of the splitter 250 is provided as an input to a multiplier 248. The multiplier 248 further receives an input from a coupler 244 which is coupled at the output of the comparison circuit 215 to couple the error signal output from the comparison circuit 215 to the input of the multiplier 248. The output of the multiplier 248 is low pass filtered by a low pass filter 262 and amplified by an amplifier 260. The low pass filter 262 is substantially similar in frequency filtering characteristics to the low pass filter 254.

The output of the low pass filter 262 is AC coupled to amplifier 260, whose output is AC coupled to the inputs to the multipliers 264, 266. The local oscillator frequency F1 generated by the local oscillator 233 is provided as a second input to multiplier 264, while the local oscillator frequency F2 generated by the local oscillator 235 is provided as a second input to multiplier 266. Thus, the multipliers 264, 266 serve as synchronous detectors which operate in a manner which is substantially the same as the multipliers 256, 258, while the multiplier 248 is substantially identical in structure and function to the multiplier 246. Thus, the multipliers 264, 266 output control signals which are filtered by integrators 265, 267, respectively, to generate the phase and gain control signals which cause the phase and gain correction circuits 209, 208 to adjust the phase and gain of the input signal applied to the input of the main amplifier 210.

Single Pilot Tone Cancellation

As illustrated in FIG. 2, a single pilot tone input is used to balance both the comparison (A) and the cancellation (C) loops. According to the method of FIG. 2, rather than following the practice of nulling the pilot tone output in the comparison loop A from comparator 215, the system 300 instead maintains the pilot tone in the output of comparison circuit 215 at a constant level so that the pilot tone is introduced into the cancellation loop in the output of the main amplifier 210, rather than by a separate input coupler. To maintain the pilot tone at a constant level, constant reference voltage(s) can be used as input(s) to the gain and phase correction circuits for the comparison loop.

Figure 3:
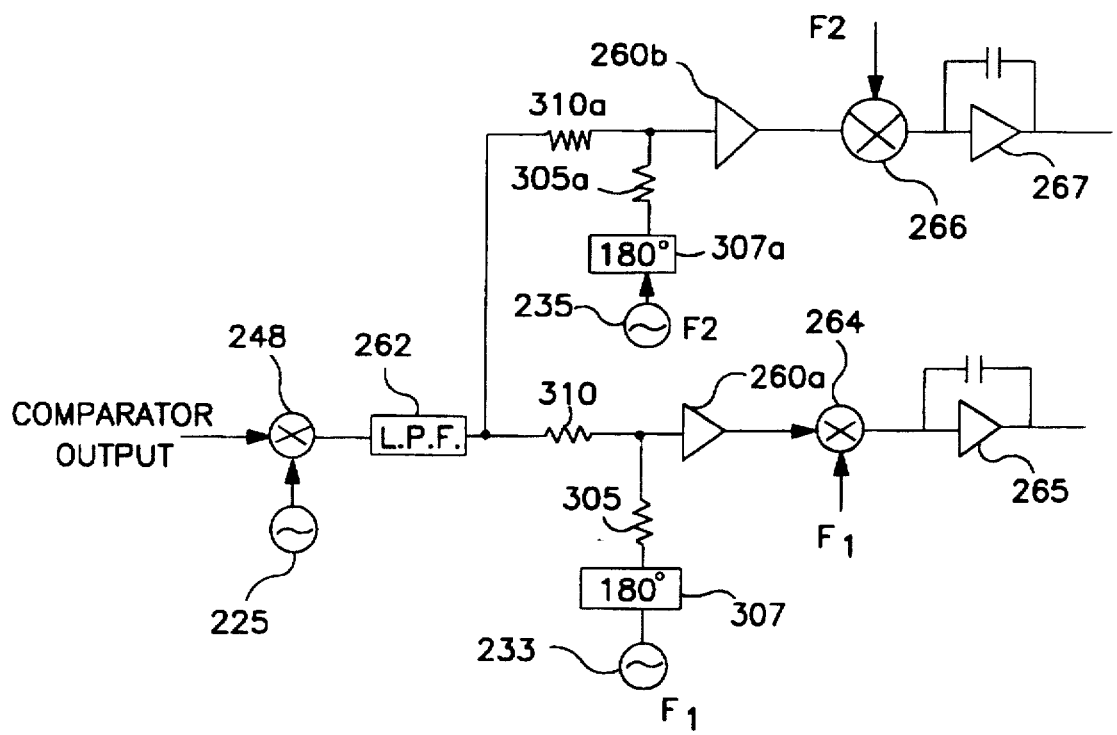
FIG. 3 is a partial schematic view of the detector path used to provide correction signals to correction circuitry in the comparison loop for an embodiment wherein the same pilot signal is used in both the comparison and cancellation loops.

It has been found, however, that such an embodiment requires a high degree of stability in the comparison loop. In order to compensate for instability in the comparison loop, a reference voltage circuit is implemented within the detector path prior to amplification by the amplifier 260. In particular, as shown in FIG. 3, a resistor 310 and a resistor 305 act as a voltage divider circuit where the input of the amplifier 260a is connected between the two resistors 305, 310. The output of the multiplier 248 includes a component which is the same frequency and phase as the local oscillator output F1. Thus, the local oscillator 233 can be used to null the output of the multiplier 248 at the input of the amplifier 260 by providing a signal which is 180° out of phase with the output of the oscillator 233, through the resistor 305, to cancel the output of the multiplier 248. This cancellation results in a selective partial cancellation of the quadrature modulated pilot signal so as to maintain a constant pilot level at the output of comparator 215. Referring still to FIG. 3, a comparable circuit is illustrated for the other correction path wherein a signal having a frequency F2, from generator 235, passes through a 180° phase shift element 307a. The output of the phase shifting element 307a passes through a resistor divider formed by resistors 305a and 310a to present to the input of amplifier 260b a reduced signal value. Accordingly, the resulting control signals are applied to the gain and phase correction circuits 208, 209 to achieve that goal. Furthermore, cancellation at this stage of detection prevents errors due to instability from being propagated and increased through amplifier 260, detector 264, and integrator filter 265. In this manner, the pilot signal is maintained at a constant level, at the output of the comparison circuit 215, as variations in the pilot signal level due to amplifier instability are minimized.

Third Embodiment

Figure 4:
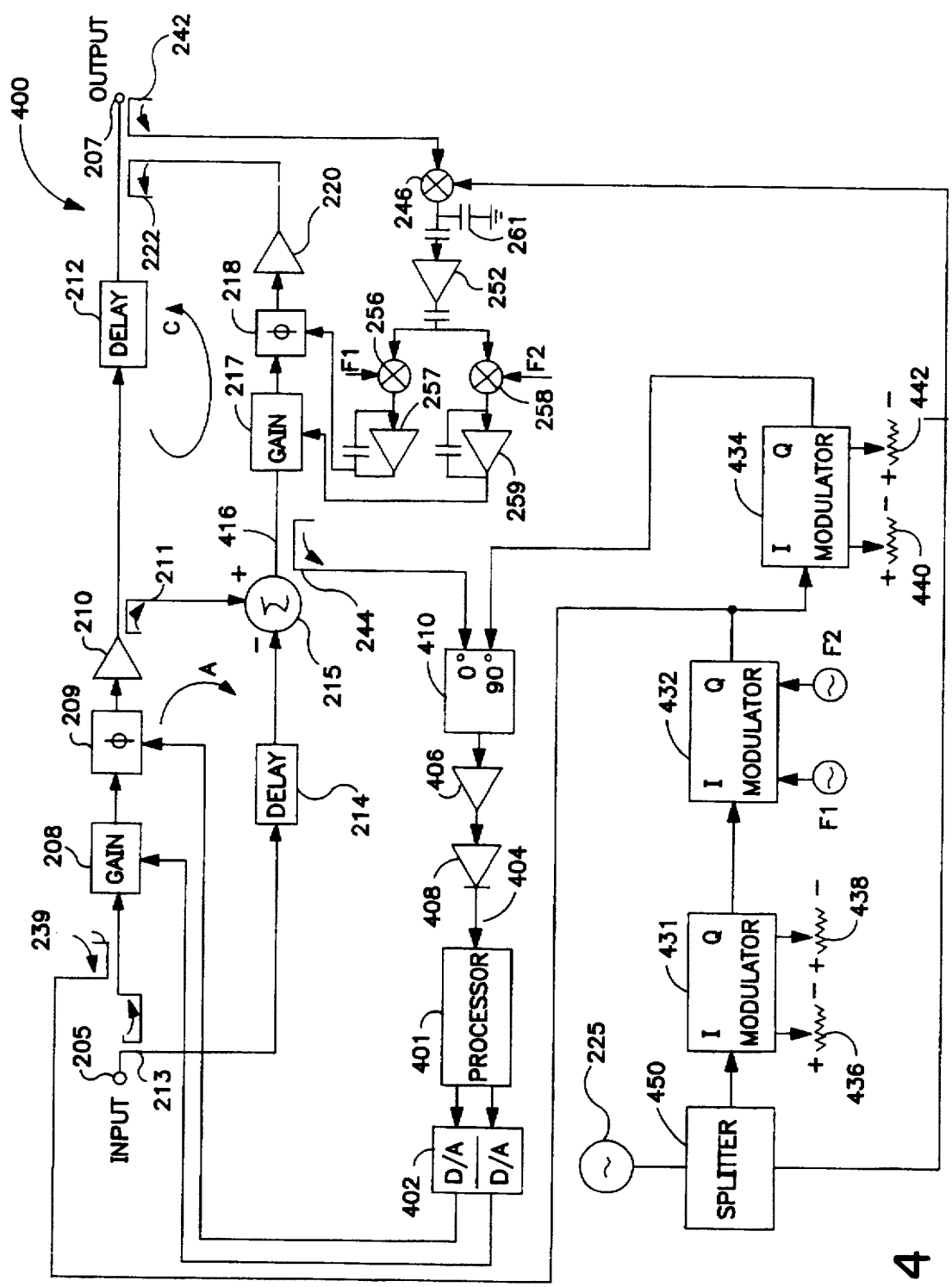
FIG. 4 is a schematic diagram of a preferred embodiment of the feed-forward, broadband amplifier system of the present invention which includes quadrature modulated pilot signal control of gain and phase correction circuits in the cancellation loop and processor control of gain and phase correction circuits in the comparison loop of the amplifier.

Referring to FIG. 4, wherein like elements which perform substantially the same functions as those of FIGS. 1 and 2 are indicated by like reference numbers, in a most preferred embodiment of the invention, a broadband amplifier 400 again has a feed forward configuration and includes a comparison loop "A" and a cancellation loop "C". In this embodiment, instead of maintaining the pilot signal at a given level at the output of the comparison circuitry 215, by providing a reference signal in the feedback control of the comparison loop, the comparison loop feedback is designed to minimize the energy in the output of the comparison circuit 215 after the pilot signal has been essentially removed or minimized in the feedback loop. In this embodiment of the invention, also, there is provided the ability to track somewhat the proper values of the control signals for the gain and phase elements 208, 209 even when the signal input at terminal 205 has been removed. Finally, the system uses an iterative approach which does not rely upon detecting the pilot signal in the comparison loop feedback control.

An input at terminal 205 of the amplifier configuration 400 shown in FIG. 4 is fed, through coupler 213, to a gain adjustment circuit 208 and a phase adjustment circuit 209. The output of phase adjustment circuit 209 is the input of the main amplifier 210. The amplifier output is directed to a delay circuit 212 and then to the output terminal 207. The output of the main amplifier 210 typically includes distortion, as noted above, which is corrected by the feed-forward cancellation loop "C".

As in connection with the embodiment of FIG. 2, the cancellation loop includes gain and phase adjustment circuits 217, 218 as well as a secondary amplifier 220 and a combining output coupler 222. The secondary amplifier 220 receives a cancellation signal from the gain and phase correction circuits 217, 218. An error signal from a subtractor 215 provides an input for the circuits 217, 218. The subtractor circuit 215 (which, together with the main amplifier 210 and the coupler 211 form a portion of the comparison loop "A") receives the signal output from the main amplifier 210 through the coupler 211, as well as the delayed input signal from a delay circuit 214. The subtractor circuit 215 determines the difference between the attenuated output signal from the amplifier 210 and the delayed input signal and provides the error signal which serves as an input to the correction circuits 217, 218. The secondary amplifier 220 amplifies the cancellation signal provided from circuits 217, 218 so that the cancellation signal is substantially equal and opposite to the distortion in the output of the delay circuit 212. Thus, by combining the cancellation signal with the output signal from delay circuit 212 through the combining output coupler 222, any distortion within the output of the main amplifier 210 is canceled so that the signal provided at the output terminal 207 is substantially a linearly amplified version of the input signal provided at the input terminal 205.

In addition to the gain and phase correction circuits 217, 218 within the cancellation loop "C", the feed-forward amplifier system depicted in FIG. 4 includes control of the gain and phase correction circuits 208, 209 within the comparison loop "A". A quadrature modulated pilot signal is introduced at the input of the main amplifier 210 through a coupler 239. This pilot signal is detected and used to provide correction signals that determine the degree of gain and phase adjustment performed within the circuits 217, 218 and to a certain extent, as described below, circuits 208, 209.

In this embodiment of the invention, the quadrature modulation generation circuitry includes three I/Q modulators 431, 432 and 434, such as those manufactured by RF Microdevices of Greensboro, N.C., as Model No. RF2422. I/Q modulator 431 is controlled by varying potentiometers 436 and 438 to vary the phase shift of the output signal generated by pilot tone generator 225, and connected to modulator 431 by signal splitter 450. The output of the modulator 431 passes to modulator 432 in which the signals F1 and F2, at frequencies respectively of 900 Hz and 1600 Hz, quadrature modulate the signal output from modulator 431. The output of modulator 432 is directed to the coupler 239, to be added to the input signal from input terminal 205, and to the third modulator 434. Modulator 434 is provided with potentiometers 440 and 442 which act to phase shift and vary the amplitude of the incoming quadrature modulated signal. The output of modulator 404 is provided to a combining circuit 410.

Advantageously, the voltages applied to the potentiometers are selected to enable a full 360° of phase shift to be achieved by each of the modulators 431 and 434. In this way, the delay circuits, which are typically achieved using a length of coaxial cable, need not be recut for each implementation of the circuitry since the adjustments can be made through the varying potentiometers 436, 438 and 440, 442. This adjustment also allows the pilot signal to be nulled at the output of combining circuit 410 without concern as to the particular delays in the main path amplification.

The quadrature modulated pilot signal coupled through coupler 439 passes through the correction circuits 208, 209, to the main amplifier 210 and is present, in amplified form, at the output of the amplifier. The pilot signal present at the output of the amplifier 210 passes through delay 212 and is provided through a coupler 242 to a multiplier 246, which also receives the original pilot signal from splitter 450. The multiplier 246 also receives the pilot signal from splitter 450 and serves as a synchronous detector which detects the quadrature modulated pilot signal in the output signal and outputs a modulation signal representative of the quadrature modulation as its output signal. During this detection process, all signals at (or near) the pilot signal frequency are shifted, so that only the modulation information and related signals near baseband, and signals in a bandwidth surrounding twice the pilot frequency are output from the multiplier 246. Further filtering and amplification of this modulation signal is carried out by an AC coupled amplifier 252 having an output coupled to multipliers 256, 258 and a low pass filter (capacitor 261 to ground) which ensures that only frequencies around F1 and F2 pass, so that no undesirable components of the output signal are present at the input of the multipliers 256, 258. Signals at the modulation frequencies F1, F2, respectively, are thus input to the multipliers 256, 258, respectively, and these multipliers 256, 258 synchronously detect the modulation signal output from the amplifier 252. The outputs of the multipliers 256, 258 serve as inputs, respectively, to integrators 257, 259 which drive, respectively, the phase correction circuit 218 and the gain correction circuit 217. The gain and phase correction circuits 217, 218 employ the signals output by the integrators 270, 272 respectively to provide gain and phase correction.

The amplitude and phase correction in the comparison loop A is controlled by a microcontroller 401 whose outputs to a pair of digital to analog converters 402 drive the amplification and phase correction circuitries 208, 209. The controller 401 receives an input from a Schottky diode circuit 404 which effectively measures the power in the signal applied to it from a pair of series connected amplifiers 406, 408 which boost the output of a combining circuit 410 by about 30 db. Circuit 410 receives its inputs from modulator 434 which connects to circuit 410 and from a second coupler 244 which takes part of the signal from subtractor 215 on line 416. As a result, circuit 410 acts to cancel a substantial portion of the pilot signal energy at its output to amplifier 406 when the phase of modulator 434 is properly adjusted.

The microprocessor 401 operates to null the level of the energy in the output of subtractor 215. That operation, when a signal is available at terminal line 205, represents, substantially a minimization of the signal component over line 416. In addition, however, when no signal is provided to the circuit at terminal 205, the minimization operation in the cancellation loop A, represents a nulling of the pilot signal which is always present through coupler 239 and which remains at the output of combiner 410. Accordingly, when the line signal reappears at terminal 205, the amplitude and phase compensation circuits 208 and 209 will be near their correct values as opposed to having to, in effect, restart from an extreme offset value. In this manner, correct compensation (and "lock") of comparison loop A can be effected more quickly when the signal appears at terminal 205.

In operation, the microprocessor controller 401 first operates upon one component, for example the phase compensation, then operates upon the other component, the amplitude compensation, and constantly repeats as time proceeds. For each duration during which it is working upon one or the other of the compensations, the controller 401 iteratively changes the applied compensation in one direction and measures the result in the signal received from the Schottky diode circuit 404. The changes in compensation are effected 10 to 20 times in each cycle for each of the phase and amplitude; and according to this iterative approach, the compensation in the comparison circuit approaches an optimal value.

Accordingly, if the change that the controller 401 makes to the compensation results in an increase in the signal received from the Schottky diode circuit 404, indicating an increase in measured energy at the diode, the controller then reverses the direction in which the signal being applied to either the gain or phase correction circuit is being changed. In a preferred embodiment of the invention, the changes in controller compensation are initially relatively large, and thereafter the changes are progressively decreased as the controller approaches the optimum value of compensation for a particular correction circuit. In this manner, the controller can be viewed to lock onto the correct value of compensation in a relatively short number of cycles. During the time when the controller is changing the compensation for one correction circuit, the compensation for the other correction circuit remains unchanged.

Although particular embodiments of the broadband amplifier system have been described and illustrated above, those skilled in the art will appreciate that various changes and modifications to the present invention do not depart from the spirit or essence of the invention. For example, gain and phase correction could be performed in the cancellation loop only as well as in both the cancellation and comparison loops. In addition, the low pass filter 254 and the low pass filter 262, (FIG. 2) may not be strictly necessary for purposes of providing inputs to the multipliers for controlling the gain and phase correction circuits. Also, the pilot signal need not be quadrature modulated to derive all of the benefits of the present invention. In practice, the quadrature components can be encoded also with other intelligence which can be later detected.

Additions, subtractions and other modifications of the illustrated embodiments of the invention will be apparent to those practiced in the field and are within the scope of the following claims.

What is claimed is:

1. An amplifier arrangement including a main amplifier to which feed-forward cancellation is applied, said amplifier arrangement comprising:

a comparison loop including a comparator which compares a signal input to said main amplifier with a signal output from said main amplifier to provide an error signal;

a cancellation loop including correction circuitry which adjusts said error signal;

a pilot signal modulation circuit which quadrature modulates an oscillation signal to generate a quadrature modulated pilot signal, a coupler for adding the quadrature modulated pilot signal to said amplifier input; and a detector circuit connected to the output of the amplifier arrangement, which provides control signals to the correction circuitry, said detector circuit extracting information from said modulated pilot signal in said amplifier arrangement output to provide said control signals.

2. The amplifier arrangement as defined in claim 1 wherein said quadrature modulated pilot signal is produced by modulating phases of said oscillation signal with at least two, independent, periodic signals.

3. The amplifier arrangement as defined in claim 2 wherein said independent periodic signals comprise sine waves at frequencies which are not multiples of each other.

4. The amplifier arrangement as defined in claim 1 wherein said main amplifier is a broadband radio frequency amplifier operating in a class AB mode.

5. The amplifier arrangement as defined in claim 1 further comprising a phase and a gain correction circuitry at the input of said main amplifier within said comparison loop.

6. The amplifier arrangement of claim 5 further comprising:
   a delay circuit connected to said signal to be amplified,
   said comparator connected to the output of the delay circuit and coupled to the output of the main amplifier for generating a difference signal representing distortion in the amplifier output signal,
   a combiner, having an output, connected to a phase shifted version of the quadrature modulated pilot signal for reducing the pilot signal energy in said difference signal,
   an energy measurement circuit for measuring the energy in the combiner output, and
   a control processor, responsive to the energy measurement circuit, for iteratively adjusting the gain and phase of the correction circuitry at the input of said amplifier to reduce the energy measured by said energy measurement circuit.

7. The amplifier arrangement of claim 6 wherein said control processor comprises:
   a controller for cyclically adjusting a phase correction control circuit, and then a gain correction control circuit, in a continuously repeating pattern.

8. The amplifier arrangement of claim 7 wherein said energy measurement circuit is a Schottky diode circuit.

9. The amplifier arrangement of claim 1 further comprising:
   a quadrature modulation generation circuit having two quadrature signal outputs, each signal output being independently adjustable over 360° of phase.

10. An amplifier configuration comprising:
    a main amplifier having an input and an output;
    a quadrature modulation pilot signal generator which generates a quadrature modulated pilot signal, said quadrature modulated pilot signal coupled to the input of the main amplifier;
    a phase and a gain correction circuit in communication with said amplifier to correct phase and gain distortion in an output signal at the output of said main amplifier; and
    a synchronous detection circuit which demodulates the quadrature modulated pilot signal present in said output signal and generates phase and gain control signals which control a phase and a gain adjustment of said phase and gain correction circuit.

11. The amplifier configuration as defined in claim 10 wherein said phase and gain correction circuit provides gain and phase correction at said amplifier input.

12. The amplifier configuration as defined in claim 10 wherein said gain and phase correction circuit provides gain and phase correction to the output of said amplifier.

13. A method of correcting gain and phase distortion in an amplified signal output from an amplifier having an input and an output, said method comprising the steps of:
    inputting a signal to be amplified at said input of said amplifier;
    injecting a quadrature modulated pilot signal at said input of said amplifier;
    demodulating a quadrature modulated pilot signal component in the output of said amplifier; and
    using said demodulated pilot signal to generate phase and gain correction signals to provide phase and gain correction of said amplified output signal.

14. The method as defined in claim 13 wherein said using step comprises the step of using said demodulated pilot signal to generate phase and gain correction signals to provide phase and gain correction of said amplified signal in a comparison loop at the input of said amplifier and in a cancellation loop at the output of said amplifier.

15. The method as defined in claim 14 wherein said injecting step comprises the step of injecting said quadrature modulated pilot signal only at said input of said amplifier while providing for correction within both said comparison loop and said cancellation loop.

16. A method of reducing distortion in an amplified signal comprising the steps of:
    encoding a constant-frequency, known, pilot signal with intelligence having at least two distinguishable modulation codes;
    adding said encoded pilot signal to a signal to be amplified;
    amplifying said signal;
    detecting said amplified signal including said injected, encoded pilot signal;
    decoding said intelligence encoded on said pilot signal to obtain information indicative of the distortion in said amplified signal; and
    independently adjusting phase and amplitude circuit parameters based upon said information, to reduce said distortion.

17. The method as defined in claim 16 wherein said distinguishable modulation codes comprise periodic sine wave oscillations at different frequencies.

18. A method of reducing distortion in a signal amplified within an amplifier circuit including a plurality of feed-forward signal correction loops to produce an amplified signal, said method comprising the steps of:
    introducing a pilot signal having at least two distinguishable modulation codes into only one of said correction loops;
    detecting said amplified signal including said introduced pilot signal to provide amplitude and phase correction signals; based at least in part on said detected pilot signal; and
    adjusting phase and amplitude parameters within two or more of said plurality of feed-forward correction loops based upon said amplitude and phase correction signals.

19. The method of reducing distortion in a signal as defined in claim 18 wherein said plurality of correction loops comprises a comparison loop which provides for amplitude and phase adjustment at an input of said amplifier circuit, and a cancellation loop which provides for amplitude and phase adjustment of an error signal derived from an output of said amplifier circuit.

20. The method of reducing distortion in a signal as defined in claim 19 wherein said pilot signal is introduced only within said comparison loop.

21. The method of reducing distortion in a signal as defined in claim 18 wherein said pilot signal is quadrature modulated.

* * * * *